US012765338B2

(12) United States Patent
Shen et al.

(10) Patent No.: US 12,765,338 B2
(45) Date of Patent: Oct. 13, 2026

(54) MOLECULAR LAYER DEPOSITION CARBON MASKS FOR DIRECT SELECTIVE DEPOSITION OF SILICON-CONTAINING MATERIALS

(71) Applicant: Applied Materials, Inc., Santa Clara, CA (US)

(72) Inventors: Zeqing Shen, San Jose, CA (US); Susmit Singha Roy, Campbell, CA (US); Abhijit Basu Mallick, Fremont, CA (US); Xinke Wang, Singapore (SG); Xiang Ji, Cupertino, CA (US); Praket Prakash Jha, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 760 days.

(21) Appl. No.: 17/954,565

(22) Filed: Sep. 28, 2022

(65) Prior Publication Data

US 2024/0105499 A1 Mar. 28, 2024

(51) Int. Cl.
*H10W 10/00* (2026.01)
*H10P 14/60* (2026.01)
(Continued)

(52) U.S. Cl.
CPC ....... *H10W 10/014* (2026.01); *H10P 14/6336* (2026.01); *H10P 14/6902* (2026.01); *H10W 10/17* (2026.01); *H10W 20/058* (2026.01)

(58) Field of Classification Search
CPC ......... H01L 21/76224; H01L 21/02115; H01L 21/02274; H01L 21/7688
See application file for complete search history.

(56) References Cited

U.S. PATENT DOCUMENTS

2012/0061763 A1* 3/2012 Lee .................... H10W 10/021 257/E29.264
2015/0311075 A1 10/2015 Huang et al.
(Continued)

FOREIGN PATENT DOCUMENTS

KR 20090058005 A 6/2009
KR 20200120750 A 10/2020
(Continued)

OTHER PUBLICATIONS ip.com search done. (Year: 2026).*
(Continued)

*Primary Examiner* — Zandra V Smith
*Assistant Examiner* — Andre C Stevenson
(74) *Attorney, Agent, or Firm* — Kilpatrick Townsend & Stockton LLP

(57) ABSTRACT

Embodiments of the present technology relate to semiconductor processing methods that include providing a structured semiconductor substrate including a trench having a bottom surface and top surfaces. The methods further include depositing a portion of a silicon-containing material on the bottom surface of the trench for at least one deposition cycle, where each deposition cycle includes: depositing the portion of the silicon-containing material on the bottom surface and top surfaces of the trench, depositing a carbon-containing mask layer on the silicon-containing material on the bottom surface of the trench, where the carbon-containing mask layer is not formed on the top surfaces of the trench, removing the portion of the silicon-containing material from the top surfaces of the trench, and removing the carbon-containing mask layer from the silicon-containing material on the bottom surface of the trench, where the as-deposited silicon-containing material remains on the bottom surface of the trench.

13 Claims, 2 Drawing Sheets

(51) Int. Cl.

| | |
|---|---|
| ***H10P 14/69*** | (2026.01) |
| ***H10W 10/17*** | (2026.01) |
| ***H10W 20/00*** | (2026.01) |

(56) References Cited

U.S. PATENT DOCUMENTS

| | | | | |
|---|---|---|---|---|
| 2016/0099154 | A1 | 4/2016 | Xue et al. | |
| 2018/0248013 | A1* | 8/2018 | Chowdhury | H10D 62/151 |
| 2019/0157075 | A1* | 5/2019 | Tu | H10P 14/6339 |
| 2021/0159084 | A1 | 5/2021 | Tomura et al. | |
| 2022/0119939 | A1* | 4/2022 | Noh | H01L 21/02271 |
| 2025/0146131 | A1* | 5/2025 | Mayorga | C23C 16/345 |

FOREIGN PATENT DOCUMENTS

| | | | |
|---|---|---|---|
| TW | 202105736 | A | 2/2021 |
| TW | 202121532 | A | 6/2021 |
| TW | 202212601 | A | 4/2022 |
| WO | 2021225790 | A1 | 11/2021 |

OTHER PUBLICATIONS

Office Action for Taiwan Appln No. 112136581 dated Aug. 5, 2024, 6 pages.
Application No. PCT/US2023/074555 , International Search Report and the Written Opinion, Mailed On Jan. 8, 2024, 10 pages.
Korean Application No. 10-2025-7013259, Office Action mailed on Dec. 16, 2025, 19 pages (11 pages of English Translation and 8 pages of Original document).

* cited by examiner

MOLECULAR LAYER DEPOSITION CARBON MASKS FOR DIRECT SELECTIVE DEPOSITION OF SILICON-CONTAINING MATERIALS

FIELD

The present technology relates to semiconductor fabrication methods to deposit silicon-containing materials in trenches, and on steps, and other structures of a semiconductor-containing component.

BACKGROUND

In microelectronics device fabrication there is a need to fill narrow trenches having aspect ratios (AR) greater than 10:1 with no voiding for many applications. One application is for shallow trench isolation (STI). For this application, the film needs to be of high quality throughout the trench (having, for example, a wet etch rate ratio less than two) with very low leakage. One method that has had past success is flowable CVD. In this method, oligomers are carefully formed in the gas phase which condense on the surface and then "flow" into the trenches. The as-deposited film is of very poor quality and requires processing steps such as steam anneals and UV-cures.

As the dimensions of the structures decrease and the aspect ratios increase post-deposition curing methods of the as deposited flowable films become difficult. Resulting in films with varying composition throughout the filled trench.

Silicon-containing materials such as amorphous silicon have been widely used in semiconductor fabrication processes as a sacrificial layer since it can provide good etch selectivity with respect to other films (e.g., silicon oxide, amorphous carbon, etc.). With decreasing critical dimensions (CD) in semiconductor fabrication, filling high aspect ratio gaps becomes increasingly important for advanced wafer fabrication. Current metal replacement gate processes involve a furnace deposited poly-silicon or amorphous silicon dummy gate. A seam forms in the middle of the Si dummy gate due to the nature of the deposition process. This seam may open during post-deposition processing and cause structure failure.

Conventional plasma-enhanced chemical vapor deposition (PECVD) of amorphous silicon (a-Si) forms a "mushroom shape" film on top of the narrow trenches due to the inability of the plasma to penetrate into the deep trenches. This results in pinching-off the narrow trench from the top; forming a void at the bottom of the trench.

Conventional thermal CVD/furnace processes can grow a-Si via thermal decomposition of a silicon precursor (e.g., silane, disilane). Due to inadequate precursor supply or presence of decomposition byproduct at the bottom of the trenches, the deposition rate is higher on the top of trenches relative to the bottom. Consequently, a narrow seam or void can be observed in trenches.

Accordingly, there is a need for methods for gapfill in high aspect ratio structures that can provide seam-free film growth.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

BRIEF SUMMARY

Figure 1:
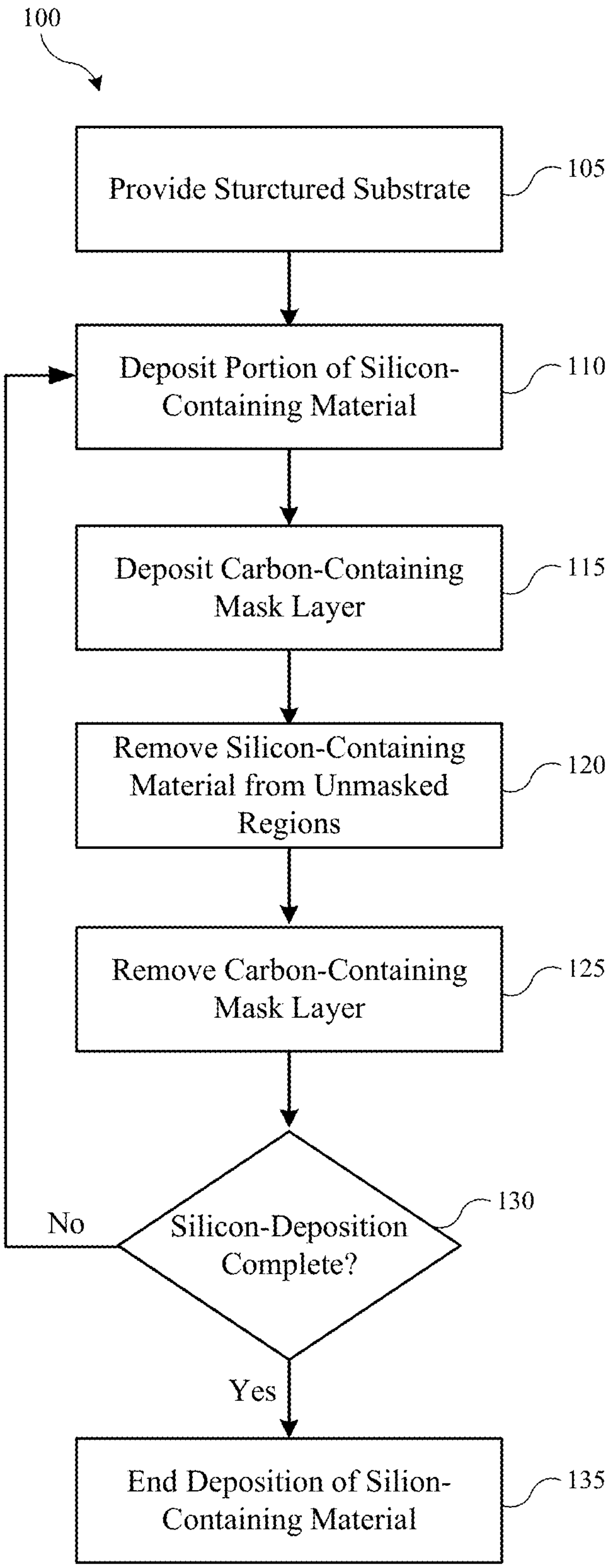
FIG. 1 shows a flowchart with selected operations of an exemplary method of filling a trench in a structured substrate according to embodiments of the present technology.

Embodiments of the present technology include semiconductor processing methods. The methods include providing a structured semiconductor substrate including a trench having a bottom surface and top surfaces laterally adjacent to the bottom surface. The methods further include depositing a portion of a silicon-containing material on the bottom surface of the trench for at least one deposition cycle, wherein each deposition cycle includes: depositing the portion of the silicon-containing material on the bottom surface and top surfaces of the trench. The cycle also includes depositing a carbon-containing mask layer on the silicon-containing material on the bottom surface of the trench, where the carbon-containing mask layer is not formed on the top surfaces of the trench. The cycle further includes removing the portion of the silicon-containing material from the top surfaces of the trench. The cycle additionally includes removing the carbon-containing mask layer from the silicon-containing material on the bottom surface of the trench, where the as-deposited silicon-containing material remains on the bottom surface of the trench.

In additional embodiments, the deposition of the portion of the silicon-containing material on the bottom surface and top surfaces of the trench includes treating the depositing silicon-containing material with ions of argon, helium, and hydrogen, where the ions are accelerated in a direction orthogonal to the structured semiconductor substrate. In further embodiments, the deposition of the carbon-containing mask layer includes depositing a first portion of a carbon-containing layer on the portion of the silicon-containing material on the bottom surface of the trench, where the first portion of the carbon layer is deposited from a first carbon-containing deposition precursor having a first reactive moiety. The first carbon-containing deposition precursor is removed from a substrate processing region in contact with structured semiconductor substrate, and a second portion of the carbon-containing layer is deposited on the first portion of the carbon-containing layer. The second portion of the carbon-containing layer is deposited from a second carbon-containing deposition precursor that includes a second reactive moiety operable to react with the first reactive moiety on the first carbon-containing deposition precursor. The as-deposited first and second portions of the carbon-containing layer are annealed to form the carbon-containing mask layer. In still further embodiments, the first reactive moiety on the first carbon-containing deposition precursor includes an aldehyde-containing moiety, and the second reactive moiety on the second carbon-containing deposition precursor includes an amine-containing moiety. In yet additional embodiments, the removing of the carbon-containing mask layer includes heating the carbon-containing mask layer in an oxygen-containing atmosphere. In more embodiments, the at least one deposition cycle includes greater than or about five deposition cycles. In yet more embodiments, the trench is characterized by a depth-to-width aspect ratio of greater than or about 3:1. In still more embodiments, the silicon-containing material is amorphous silicon or silicon nitride.

Additional embodiments of the present technology include further semiconductor processing methods. The methods include providing a structured semiconductor substrate that includes a trench having a bottom surface, top surfaces, and sidewall surfaces adjacent to the bottom surface and top surfaces. The methods further include depositing a first portion of a silicon-containing layer on the trench, where the first portion of the silicon-containing layer is characterized by a bottom thickness on the bottom surface that is greater than a sidewall thickness on the sidewall surfaces of the trench. The methods still further include forming a carbon-containing mask layer on the first portion of the silicon-containing layer in the bottom surface of the trench. The methods additionally include removing at least some of the first portion of the silicon-containing layer from the top surfaces and the sidewall surfaces of the trench, where the carbon-containing mask layer prevents the removal of the first portion of the silicon-containing layer from the bottom surface of the trench. The methods yet additionally include removing the carbon-containing mask layer from the bottom surface of the trench and forming a second portion of the silicon-containing layer on the trench.

In further embodiments, the depositing of the first portion of the silicon-containing layer on the trench includes generating a deposition plasma in a plasma deposition chamber containing the structured semiconductor substrate, where the deposition plasma is generated from deposition precursors that include a silicon-containing precursor, argon, helium, and molecular hydrogen. The first portion of the silicon-containing layer is deposited on the trench from species formed within the deposition plasma in the deposition chamber. In additional embodiments, the deposition plasma is generated by supplying RF power to the deposition precursors at a power level of less than or about 500 Watts. In still further embodiments, the removing at least some of the first portion of the silicon-containing layer from the top surfaces and the sidewall surfaces of the trench includes contacting the first portion of the silicon-containing layer with an etch plasma, where the etch plasma includes hydrogen ions. In yet additional embodiments, the etch plasma is generated by supplying RF power to etch precursors at a power level of greater than or about 1500 Watts. In more embodiments, the first portion and the second portion of the silicon-containing layer include amorphous silicon or silicon nitride.

Further embodiments of the present technology include a semiconductor structure that includes a structured semiconductor substrate that includes a trench having a bottom surface, top surface, and sidewall surfaces adjacent to the bottom and top surfaces. The semiconductor structure further includes a silicon-containing material positioned in the trench, where the silicon-containing material includes at least one of amorphous silicon and silicon nitride, and where the silicon-containing material is characterized by a refractive index of greater than or about 3.0. The semiconductor structure is also characterized by the top surfaces of the trench being free of the silicon-containing material.

In more embodiments, the trench is characterized by a depth-to-width aspect ratio of greater than or about 3:1. In still more embodiments, the bottom surface of the trench is characterized by a width of less than or about 10 nm. In additional embodiments, the structured semiconductor substrate includes polysilicon or crystalline silicon. In further embodiments, the silicon-containing material positioned in the trench is characterized by less than 1 wt. % carbon. In still further embodiments, the silicon-containing material positioned in the trench is free of voids or seams.

The present technology provides several benefits over conventional methods of depositing silicon-containing material in narrow-width, high aspect ratio trenches in structured semiconductor substrates. In embodiments, the present technology can directionally deposit silicon-containing material on the bottom surface of a trench without an accompanying buildup of the material on the sidewall and top surfaces of the trench. In further embodiments, a selectively deposited carbon-containing mask formed on the silicon-containing material on the bottom surface of the trench protects the removal of that material during a selective removal operation that removes the material from the sidewall and top surfaces of the trench. The combination of the directional deposition and mask-protected selective removal of the silicon-containing material provides a rapid deposition of a high-quality, void-free silicon-containing material in the trench. These and other embodiments, along with many of their advantages and features, are described in more detail in conjunction with the below description and attached figures.

DETAILED DESCRIPTION

Technological advances in semiconductor fabrication technology are reducing the distance between adjacent structural features on patterned semiconductor substrates to 10 nanometers (nm) and less. As this distance continues to shrink, the trenches formed between the structural features become increasingly difficult to fill in a uniform manner with dielectric materials. The difficulties arise, in part, from the increasing depth-to-width aspect ratio of the trenches that are caused by the width of the trench decreasing faster than its height (i.e., depth). As the aspect ratio of the trench increases at these small nanometer dimensions, it becomes increasingly difficult to form a deep layer of dielectric material on the bottom surface of the trench before it becomes blocked with the material at the top of the trench. The result is a void or seam forming around the middle of the dielectric volume that can have adverse effects on the performance of the adjacent semiconductor components.

Techniques have been developed to address the gapfill problem for dielectric materials, including the use of flowable dielectric precursors that permit the dielectric to fill the trench from the bottom up like pouring a liquid into a glass. These techniques have been successful filling small, high-aspect-ratio trenches with silicon-containing dielectrics characterized by high carbon and oxygen content. In embodiments, they employ a remote plasma to generate flowing silicon-carbon-and-oxygen-containing deposition precursors that flow into the trenches and cure into silicon oxide and silicon-carbon-oxygen-containing dielectric materials. Unfortunately, these flowable deposition techniques have not been as successful filling these trenches with silicon-containing dielectrics having little or no oxygen and carbon, such as amorphous silicon and silicon nitride.

Additional techniques have been developed to address gapfill problems for silicon-containing materials with little or no oxygen and carbon. These include the direct selective filling of the silicon-containing material on the bottom surface of the trench while less of the material forms on the trench's sidewalls and top surfaces. In embodiments, the direct selective filling techniques also include removing a portion of the silicon-containing material from the top and sidewall surfaces while less material is removed from the bottom surface. Through a number of these selective filling and removal cycles, the silicon-containing material may fill the trench from the bottom up without forming a void or seam in the material.

While direct selective filling techniques have been successful providing high-quality, void-and-seam-free depositions of low-carbon and low-oxygen silicon-containing materials in trenches, they have suffered from lower process efficiency and resulting lower wafer throughput due to the partial removal of the material on the bottom surface of the trench occurring in each material removal cycle. The present technology addresses this problem by forming a carbon-containing mask layer on silicon-containing material deposited on the bottom surface of the trench before the removal part of the cycle removes the silicon-containing material from the sidewall and top surfaces of the trench. The carbon-containing mask layer is selectively formed on the silicon-containing material deposited on the bottom surface of the trench by molecular layer deposition (MLD) that uses at least two different deposition precursors containing different reactive moieties that react with each other to form the carbon-containing layer when contacted. After the selective removal of the silicon-containing material from the sidewall and top surfaces of the trench, the carbon-containing mask layer is removed to provide an as-deposited silicon-containing material on the bottom surface of the trench for the next selective deposition and removal cycle. The incorporation of the carbon-containing mask layer increases the efficiency of process of depositing the silicon-containing material in the trench.

FIG. 1 shows a flowchart with selected operations in a method 100 of depositing a silicon-containing material in a trench of a structured semiconductor substrate 200, according to embodiments of the present technology. Method 100 may or may not include one or more operations prior to the initiation of the method, including front-end processing, deposition, etching, polishing, cleaning, or any other operations that may be performed prior to the described operations. The method may include optional operations, which may or may not be specifically associated with some embodiments of methods according to the present technology. Method 100 describes operations to form embodiments of trenches filled with a silicon-containing material in a structured semiconductor substrate, a portion of one of which is shown in a simplified schematic form a structure 200 in FIG. 2D. The cross-sectional view of the structure 200 in FIG. 2D is a split-open cross-sectional view. FIG. 2D illustrates only a partial schematic view with limited details. In further embodiments that are not illustrated, exemplary structures may contain additional layers, regions, and materials, having aspects as illustrated in the figures, as well as alternative structural and material aspects that may still benefit from any of the aspects of the present technology.

Method 100 includes providing a structured substrate 202 at operation 105. In embodiments, the structured substrate 202, shown in FIG. 2A, may include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. In additional embodiments, structured substrates may include semiconductor wafers. In further embodiments, the structured substrate 202 may be exposed to a pretreatment process to polish, etch, reduce, oxidize, hydroxylate, anneal, UV cure, e-beam cure and/or bake the substrate surface. In addition to film processing directly on the surface of the structured substrate itself, in the present disclosure, any of the film processing steps disclosed may also be performed on an underlayer formed on the structured substrate as disclosed in more detail below, and the term "surface" is intended to include such underlayer as the context indicates. Thus for example, where a film/layer or partial film/layer has been deposited onto a bottom surface of a trench in the structured substrate, the exposed surface of the newly deposited film/layer becomes the bottom surface.

Figure 2A:
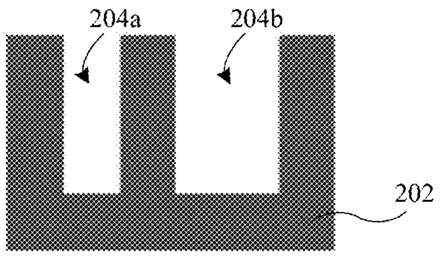
FIGS. 2A-D show simplified cross-sectional views of fabrication stages for an exemplary structured structure according to embodiments of the present technology.

In the embodiment of structured substrate 202 shown in FIG. 2A, the structured substrate includes two features in the form of trenches 204*a-b* for illustrative purposes. Those skilled in the art will understand that there can be additional features. The shape of the features can be any suitable shape including, but not limited to, additional trenches and cylindrical vias, among other features. As used in this regard, the term "feature" means any intentional surface irregularity. Suitable examples of features include, but are not limited to trenches (also referred to as gaps) which have top surfaces forming peaks that are laterally adjacent a bottom surface, as well as sidewall surfaces vertically positioned between the top and bottom surfaces of the trench. In further embodiments, the bottom surface may be characterized by a width of less than or about nm, less than or about 15 nm, less than or about 12.5 nm, less than or about 10 nm, less than or about 9 nm, less than or about 8 nm, less than or about 7 nm, less than or about 6 nm, less than or about 5 nm, or less. In still further embodiments, an aspect ratio (i.e., the ratio of the depth of the trench to the width of the trench) may be characterized as greater than or about 1:1, 2:1, 3:1, 4:1, 5:1, 6:1, 7:1, 8:1, 9:1, 10:1, 15:1, 20:1, 25:1, 30:1, 35:1, 40:1, or more.

Figure 2B:
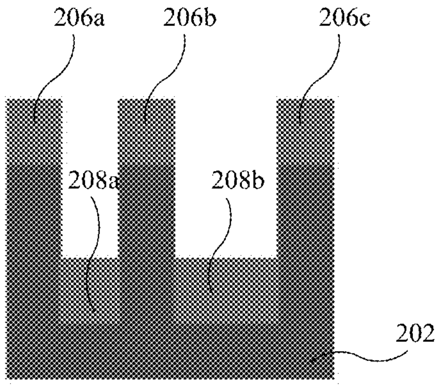

Method 100 also includes depositing a first portion of the silicon-containing material on the structured substrate 202 at operation 110. In embodiments, the deposition of the first-portion of the silicon-containing material includes depositing first top portions of the silicon-containing material 206*a-b* on the top surfaces of the trenches 204*a-b*, and depositing first bottom portions of the silicon-containing material 208*a-b* on the bottom surfaces of the trenches 204*a-b*, as shown in FIG. 2B. In embodiments, the first portion of the silicon-containing material may be deposited by a plasma-enhanced chemical vapor deposition (PECVD) process or a plasma-enhanced atomic layer deposition (PEALD) process. In additional embodiments, the deposition operation 110 may include a PECVD process that includes a first pulsed high-frequency radio-frequency (HFRF) plasma. In embodiments, the first pulsed HFRF plasma may include a plurality of first HFRF pulses. The use of ordinals such as "first", "second", etc., are used to identify different processes or components and are not intended to imply a specific order of operation or use. In additional embodiments, the high-frequency radio-frequency plasma includes high-frequency on/off pulses of power. When on, the power may be delivered frequencies such as radio-frequencies. The pulse frequency and radio frequency refer to different aspects of the power used to generate a plasma that can be independently controlled.

In additional embodiments, the silicon-containing material may include at least one of amorphous silicon or silicon nitride, among other silicon-containing materials. In further embodiments, the silicon-containing material may consist essentially of silicon nitride. In further embodiments, the silicon-containing material may consist essentially of amorphous silicon. As used in this manner, the term "consists essentially of" means that the silicon-containing material is greater than or equal to about 90%, 93%, 95%, 98% or 99% of amorphous silicon or silicon nitride (or another stated species) on an atomic basis. In some embodiments, the silicon-containing material comprises amorphous silicon and silicon nitride. In more embodiments, the silicon-containing material comprises substantially only amorphous silicon. As used in this manner, the term "substantially only amorphous silicon" means that the silicon-containing material is greater than or equal to about 90%, 93%, 95%, 98% or 99% amorphous silicon.

In more embodiments, the silicon-containing material may include little or no oxygen or carbon. In embodiments, the silicon-containing material may be characterized by a mole percentage of oxygen of less than or about 5 mol. %, less than or about 4 mol. %, less than or about 3 mol. %, less than or about 2 mol. %, less than or about 1 mol. %, or less. In additional embodiments, the silicon-containing material may be characterized by a mole percentage of carbon of less than or about 5 mol. %, less than or about 4 mol. %, less than or about 3 mol. %, less than or about 2 mol. %, less than or about 1 mol. %, or less.

In further embodiments, the first portion of the silicon-containing material is selectively deposited on the structured substrate 202. In embodiments, the first portion of the silicon-containing material is deposited at different rates on the top surfaces, bottom surfaces, and sidewalls of the trenches 204*a-b*. In additional embodiments, the as-deposited first portion of the silicon-containing material is characterized by a bottom film thickness on the bottom surfaces of the trenches 204*a-b* that is greater than a top film thickness on the top surfaces of the trenches. In more embodiments, the as-deposited first portion of the silicon-containing material is characterized by a top film thickness that is greater than a sidewall film thickness on the sidewall surfaces of the trenches 204*a-b*.

In more embodiments, the first portion of the silicon-containing material forms non-conformally on the structured substrate 202. As used herein, the term "non-conformal", or "non-conformally", refers to a layer that adheres to and non-uniformly covers exposed surfaces with a thickness variation of greater than 10% relative to the average thickness of the film. For example, a film having an average thickness of 100 Å would have greater than 10 Å variations in thickness. This thickness variation includes edges, corners, sides, and the bottom of recesses. In some embodiments, the variation is greater than or equal to 10%, 15%, 20%, 25%, 30%, 35%, 40%, 45%, 50%, 55%, 60%, 65%, 70%, 75%, 80%, 85% or 90%. In some embodiments, a film deposited on sidewalls of a trench is thinner than the thickness of the film deposited on the bottom of the trench or surface in which the trench is formed. In some embodiments, the average thickness of the deposited film on the sidewalls is less than or equal to 90%, 80%, 70%, 60%, 50%, 40%, 30% or 20% of the average thickness on the bottom and/or top of the trench.

In yet more embodiments, the first portion of the silicon-containing material is deposited to the average thickness in the range of from 1 nm to 100 nm, from 1 nm to 80 nm, from 1 nm to 50 nm, from 10 nm to 100 nm, from 10 nm to 80 nm, from 10 nm to 50 nm, from nm to 100 mil, from 20 nm to 80 nm or from 20 nm to 50 mil before stopping deposition. In additional embodiments, the first portion of the silicon-containing material is deposited to the average thickness in the range of from 5 nm to 100 nm, from 5 nm to 80 nm, from 5 nm to 40 nm, from 5 nm to 30 nm or from 10 nm to 30 nm.

In embodiments, the process parameters used for depositing the first portion of the silicon-containing material can affect the film thickness on the top surfaces, the sidewall surfaces, and the bottom surfaces of the trenches 204*a-b*. For example, the particular precursors and/or reactive species, plasma conditions, and temperature, among other process parameters, can affect the thickness of the deposition on the different trench surfaces. In further embodiments, the thickness at the top surface is greater than the thickness at the sidewall surface of the trenches 204*a-b*. In more embodiments, the thickness at the bottom surfaces of the trenches is greater than the thickness at the sidewall and top surfaces of the trenches 204*a-b*.

In embodiments, the substrate structure 202 is exposed to one or more process gases and/or conditions that form the first portion of the silicon-containing material. In additional embodiments, the process gas flows into a processing region of a process chamber and a pulsed HIRE plasma. Is formed from the process gas to deposit the first portion of the silicon-containing material. The process gas of some embodiments includes a silicon precursor and a carrier gas, and the carrier gas is ignited into a plasma by FEU power.

In more embodiments, the first pulsed plasma is a conductively-coupled plasma (CCP) or inductively coupled plasma (ICP). In yet more embodiments, the first pulsed HFRF plasma is a direct plasma or a remote plasma. In still more embodiments, each of the plurality of first HFRF pulses are independently generated at a first power in a range of from 0 W to 500 W, from 50 W to 500 W, from 50 W to 400 W, from 50 W to 300 W, from 50 W to 200 W, from 50 W to 100 W, from 100 W to 500 W, from 100 W to 400 W, from 100 W to 300 W, from 100 W to 200 W, from 200 W to 500 W, from 200 W to 400 W or from 200 W to 300 W. In some embodiments, the minimum first plasma power is greater than 0 W. In some embodiments, all of the first pulses have the same power. In some embodiments, the individual pulse powers in the first HFRF plasma vary.

In embodiments, the plurality of first HFRF plasma pulses have a first duty cycle in a range of from 1% to 50%, from 1% to 45%, from 1% to 40%, from 1% to 35%, from 1% to 30%, from 1% to 25%, from 1% to 20%, form 1% to 15%, from 1% to 10%, from 5% to 50%, from 5% to 45%, from 5% to 40%, from 5% to 35%, from 5% to 30% from 5% to 25%, from 5% to 20%, form 5% to 15%, from 5% to 10%, from 10% to 50%, from 10% to 45%, from 10% to 40%, from 10% to 35%, from 10% to 30%, from 10% to 25%, from 10% to 20% or form 10% to 15%. In additional embodiments, each of the plasma pulses during the deposition process have the same duty cycle. In some embodiments, the duty cycle changes during the deposition process.

In further embodiments, each of the plurality of first HFRF plasma pulse independently has a pulse width in a range of from 5 msec to 50 µsec, from 4 msec to 50 µsec, from 3 in sec to 50 µsec, from 2 msec to 50 µsec, from 1 msec to 50 µsec, from 800 µsec to 50 µsec, from 500 µsec to 50 µsec, from 200 µsec to 50 µsec, from 5 msec to 100 µsec, from 4 msec to 100 µsec, from 3 msec to 100 µsec, from 2 msec to 100 µsec, from 1 msec to 100 µsec, from 800 µsec to 100 µsec, from 500 µsec to 100 µsec and from 200 µsec to 100 µsec. In embodiments, each of the pulse widths are the same during the deposition process. In some embodiments, the pulse widths vary during the deposition process.

In one or more embodiments, each of the plurality of first HFRF plasma pulses independently has a first pulse frequency in a range of from 0.1 kHz to 20 kHz, from 0.1 kHz to 15 kHz, from 0.1 kHz to 10 kHz, from 0.1 kHz to 5 kHz, 0.5 kHz to 20 kHz, from 0.5 kHz to 15 kHz, from 0.5 kHz to 10 from kHz, 0.5 kHz to 5 kHz, 1 kHz to 20 kHz, from 1 kHz to 15 kHz, from 1 kHz to 10 kHz, from 1 kHz to 5 kHz, 2 kHz to 20 kHz, from 2 kHz to 15 kHz, from 2 kHz to 10 kHz or from 2 kHz to 5 kHz. In embodiments, the pulse frequency remains the same during the deposition process. In additional embodiments, the pulse frequency varies during the deposition process.

In one or more embodiments, the plurality of first HFRF pulses have a first radio frequency in a range of from 5 MHz to 20 MHz, from 5 MHz to 15 MHz, from 5 MHz to 10 MHz, from 10 MHz to 20 MHz or from 10 MHz to 15 MHz. In one or more embodiments, the plurality of first HFRF pulses have the first radio frequency of 13.56 MHz. In some embodiments, the radio frequency of the pulses are the same during the deposition process. In some embodiments, the radio frequencies of the pulses vary during the deposition process in one or more embodiments, the each of the plurality of first HFRF pulses independently has a first radio frequency in a range of from 5 MHz to 20 MHz, from 5 MHz to 15 MHz, from 5 MHz to 10 MHz, from 10 MHz to 20 MHz or from 10 MHz to 15 MHz. In one or more embodiments, the each of the plurality of first HFRF pulses independently has the first radio frequency of 13.56 MHz.

In embodiments, each of the plurality of first ELM pulses have a first duty cycle in a range of from 1% to 50%, from 1% to 45%, from 1% to 40%, from 1% to 35%, from 1% to 30%, from 1% to 25%, from 1% to 20%, form 1% to 15%, from 1% to 10%, from 5% to 50%, from 5% to 45%, from 5% to 40%, from 5% to 35%, from 5% to 30%, from 5% to 25%, from 5% to 20%, form 5% to 15%, from 5% to 10%, from 10% to 50%, from 10% to 45%, from 10% to 40%, from 10% to 35%, from 10% to 30%, from 10% to 25%, from 10% to 20% or form 10% to 15%. In some embodiments, the duty cycles of the pulses are the same during the deposition process. In some embodiments, the duty cycles of the pulses vary during the deposition process. The deposition process can occur at any suitable substrate temperature. In some embodiments, during the deposition process, the substrate is maintained at a temperature in the range of 15° C. to 250° C., from 15° C. to 225° C., from 15° C. to 200° C., from 15° C. to 175° C., from 15° C. to 150° C. from 15° C. to 125° C. from 15° C. to 100° C., from 25° C. to 250° C., from 25° C. to 225° C., from C to 200° C., from 25° C. to 175° C., from 25° C. to 150° C., from 25° C. to 125° C., from 25° C. to 100° C., from 50° C. to 250° C., from 50° C. to 225° C., from 50° C. to 200° C., from 50° C. to 75° C. from 50° C. to 150° C., from 50° C. to 125° C., from 50° C. to 100° C., from 75' C to 250° C., from 75° C. to 225° C., from 75° C. to 200° C., from 75° C. to 175° C., from 75° C. to 150° C., from 75° C. to 125° C. or from 75° C. to 100° C.

In additional embodiments, the film deposition process may include flowing one or more of a first carrier gas, a precursor or a first reactant onto the substrate surface. In some embodiments, the carrier gas includes but is not limited to argon (Ar), helium He, $H_2$ or $N_2$. In some embodiments, the carrier gas comprises or consists essentially of helium (He). In some embodiments, the carrier gas comprises argon (Ar). In one or more embodiments, the precursors include, but are not limited to, silane, disilane, dichlorosilane (DCS), trisilane, or tetrasilane. In some embodiments, the precursor gas comprises silane ($SiH_4$). In some embodiments, the precursor gas comprises or consists essentially of disilane ($Si_2H_6$). In some embodiments, the precursor gas is heated in a hot can to increase the vapor pressure and be delivered to the chamber using the carrier gas. In some embodiments, the first reactant gas comprises $H_2$.

In more embodiments, each of the first carrier gas, the precursor gas or the first reactant gas are flown onto the substrate surface independently at a dose in a range of from 40 sccm to 10000 sccm, from 40 sccm to 5000 sccm, from 40 sccm to 2000 sccm from 40 sccm to 1000 sccm, from 40 sccm to 500 sccm, from 40 sccm to 100 sccm, from 100 sccm to 10000 sccm, from 100 sccm to 5000 sccm, from 100 sccm to 2000 sccm, from 100 sccm to 1000 sccm, from 100 sccm to 500 sccm, from 250 sccm to 1000 sccm, from 250 sccm to 5000 sccm, from 250 sccm to 2000 sccm, from 250 sccm to 1000 sccm, from 250 sccm to 500 sccm, from 500 sccm to 10000 sccm, from 500 sccm to 5000 sccm, from 500 sccm to 2000 sccm or from 500 sccm to 1000 sccm.

In embodiments, the first portion of the silicon-containing material deposited during deposition process is a continuous film. As used herein, the term "continuous" refers to a layer that covers an entire exposed surface without gaps or bare spots that reveal material underlying the deposited layer. A continuous limn may have gaps or bare spots with a surface area less than about 1% of the total surface area of the film.

In some embodiments, after the deposition operation 110 but before additional operations, the structured substrate 202 may be subject to a purging treatment and/or vacuum treatment. In some embodiments, a purge gas, such as argon, is introduced into the processing chamber to purge the reaction zone or otherwise remove any residual reactive compound or by-products from the reaction zone between the deposition operation 110 and additional operations. In some embodiments, the purge gas is continuously flowed into the processing chamber throughout the method 100. In some embodiments, a negative pressure is applied into the processing chamber to remove any residual reactive compound or by-products from the deposition region of the chamber between the deposition operation and additional operations. In some embodiments, the negative pressure is continuously applied into the processing chamber throughout the method 100. In some embodiments, the purging treatment and/or vacuum treatment is applied before any post-processing operations.

Figure 2C:
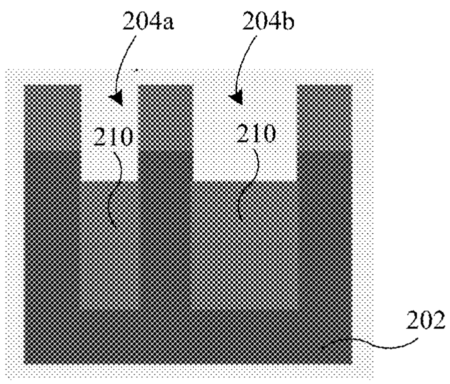
Figure 2D:
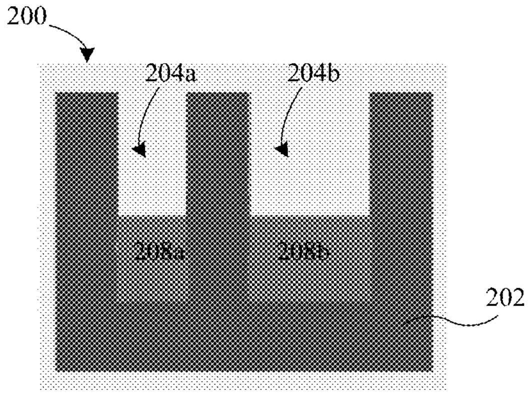

Method 100 also includes depositing a carbon-containing mask layer 210 on the first portion of the silicon-containing material at operation 115. In embodiments, the deposition of the carbon-containing mask layer 210 may include a molecular layer deposition (MLD) of a carbon layer on the first portion of the silicon-containing material, as shown in FIG. 2C. In additional embodiments, the MLD-C deposition may include flowing a first deposition precursor into a substrate processing region that includes the structured substrate 202 with the first portion of the silicon-containing material. In further embodiments, the first precursor may be a carbon-containing precursor that has at least two reactive groups that can form a bond with a group attached to a surface of a substrate in the substrate processing region. Molecules of the first precursor react with the surface groups to form bonds linking the first precursor molecule to the substrate surface. The reactions between the first precursor molecules and the groups on the substrate surface continue until most or all the surface groups are bonded to a reactive group on the first precursor molecules. A first portion of a compound layer of the deposition precursors is formed that blocks further reaction between first precursor molecules in the first precursor effluent and the substrate.

In additional embodiments, the formation rate of the first portion of the compound layer may depend on the temperature of the substrate as well as the temperature of the deposition precursors that flow into the substrate processing region. Exemplary substrate temperatures during the formation operations may be greater than or about 50° C., greater than or about 60° C. greater than or about 70° C., greater than or about 80° C., greater than or about 90° C., greater than or about 100° C., greater than or about 110° C., greater than or about 120° C., greater than or about 130° C., greater than or about 140° C., greater than or about 150° C., or higher. By maintaining the substrate temperature elevated, such as above or about 100° C. in some embodiments, an increased number of nucleation sites may be available along the substrate, which may improve formation and reduce void formation by improving coverage at each location.

In more embodiments, the first deposition precursors may be delivered at any number of temperatures to effect increase ligand formation across the substrate to improve initial formation and coverage across the substrate. The first deposition precursor may be delivered at a temperature above or about 80° C., and may be delivered at a temperature greater than or about C, greater than or about 100° C., greater than or about 110° C., or greater. By increasing the deposition of the first precursor, an increased number of deposit sites may be formed, which may more seemlessly grow material on the substrate. Additionally, this may allow the second deposition precursor to be delivered at a temperature less than the first temperature. In some embodiments the reaction between the second deposition precursor and the first deposition precursor may occur more readily than a reaction between the first deposition precursor and the substrate, and thus delivering the first deposition precursor at an elevated temperature may ensure adequate formation across the substrate. The second deposition precursor may then react with reactive groups of the first deposition precursor at reduced temperatures. For example, the second deposition precursor may be delivered at a temperature less than or about 100° C., and may be delivered at a temperature less than or about 90° C., less than or about 80° C., less than or about 70° C., less than or about 60° C. less than or about 50° C. less than or about 40° C., or less.

In embodiments, the formation rate of the first portion of the compound layer may also depend on the pressure of the first deposition precursor effluent in the substrate processing region. Exemplary effluent pressures in the substrate processing region may range from about 1 mTorr to about 500 Torr. Additional exemplary ranges include 1 Torr to about 20 Torr, 5 Torr to 15 Torr, and 9 Torr to 12 Torr, among other exemplary ranges.

In further embodiments, the first deposition precursor effluent may remain in the substrate processing region for a period of time to nearly or completely form the first portion of the compound layer. The precursors may be delivered in alternating pulses to grow the material. In some embodiments, the pulse times of either or both of the first deposition precursor and the second deposition precursor may be greater than or about 0.5 seconds, greater than or about 1 second, greater than or about 2 seconds, greater than or about 3 seconds, greater than or about 4 seconds, greater than or about 5 seconds, greater than or about 10 seconds, greater than or about seconds, greater than or about 40 seconds, greater than or about 60 seconds, greater than or about 80 seconds, greater than or about 100 seconds, or more. In some embodiments the first deposition precursor may be pulsed for longer periods of time than the second deposition precursor. Similar to temperature as noted above, by increasing the residence time of the first deposition precursor, improved adhesion may be produced across the substrate. The second deposition precursor may then more readily react with the ligands of the first deposition precursor, and thus the second deposition precursor may be pulsed for less time, which may improve throughput. For example, in some embodiments, the second precursor may be pulsed for less than or about 90% of the time the first precursor is pulsed. The second precursor may also be pulsed for less than or about 80% of the time the first precursor is pulsed, less than or about 70% of the time the first precursor is pulsed, less than or about 60% of the time the first precursor is pulsed, less than or about 50% of the time the first precursor is pulsed, less than or about 40% of the time the first precursor is pulsed, less than or about 30% of the time the first precursor is puked, or less.

In additional embodiments, the first deposition precursor effluents may be purged or removed from the substrate processing region following the formation of the first portion of the compound layer. The effluents may be removed by pumping, them out a the substrate deposition region for a period of time ranging from about 10 seconds to about 100 seconds. Additional exemplary time ranges may include about 20 seconds to about 50 seconds, and 25 seconds to about 45 seconds, among other exemplary time ranges. However, in some embodiments, increased purge time may begin to remove reactive sites, which may reduce uniform formation. Accordingly, in some embodiments the purge may be performed for less than or about 60 seconds, and may be performed for less than or about 50 seconds, less than or about 40 seconds, less than or about 30 seconds, or less. In some embodiments, a purge gas may be introduced to the substrate processing region to assist in the removal of the species. Exemplary purge gases include helium and nitrogen, among other purge gases.

In embodiments, first deposition precursor may be characterized by a first formula that includes:

$$Y_1—R_1—Y_2,$$

where $R_1$ comprises one or more of an alkyl group, an aromatic group, or a cycloalkyl group, and $Y_1$ and $Y_2$ independently comprise a hydroxide group, an aldehyde group, a ketone group, an acid group, an amino group, an isocyanate group, a thiocyanate group, or an acyl chloride group. In more embodiments, exemplary first deposition precursors may include terephthalaldehyde and 1,4-phenylene diisocyanate, among other first deposition precursors.

After the removal of the first deposition precursor effluents, a second deposition precursor may be introduced to the structured substrate. In embodiments, the second precursor may be a carbon-containing precursor that has at least two reactive groups that can form bonds with unreacted reactive groups of the first deposition precursor that formed the first portion of the compound laver. Molecules of the second precursor react with the unreacted reactive groups of the first deposition precursor to form bonds linking the second precursor molecules to the first precursor molecules. The reactions between the second and first precursor molecules continue until most or all the unreacted reactive groups on the first precursor molecules have reacted with second precursor molecules. A second portion of a compound layer of the deposition precursors is formed that blocks further reaction between second precursor molecules in the second precursor effluent and the first portion of the compound layer.

In additional embodiments, the formation rate of the second portion of the compound layer may also depend on the pressure of the second deposition precursor effluent in the substrate processing region. Exemplary effluent pressures in the substrate processing region may range from about 1 Torr to about 20 Torr. Additional exemplary ranges include 5 Torr to 15 Torr, and 9 Torr to 12 Torr, among other exemplary ranges.

In further embodiments, the second deposition precursor effluents may be purged or removed from the substrate processing region following the formation of the second portion of the compound layer. The effluents may be removed by pumping them out of the substrate deposition region for a period of time ranging from about 10 seconds to about 100 seconds. Additional exemplary time ranges may include about 20 seconds to about 50 seconds, and 25 seconds to about 45 seconds, among other exemplary time ranges. In some embodiments, a purge gas may be introduced to the substrate processing region to assist in the removal of the effluents. Exemplary purge gases include helium and nitrogen, among other purge gases.

In embodiments, the second deposition precursor may be characterized by a second formula that includes:

$$Z_1—R_2—Z_2,$$

where $R_2$ comprises one or more of an alkyl group, an aromatic group, or a cycloalkyl group, and $Z_1$ and $Z_2$ independently comprise a hydroxide group, an aldehyde group, a ketone group, an acid group, an amino group, an isocyanate group, a thiocyanate group, or an acyl chloride group. In additional embodiments, exemplary second deposition precursors may include ethylene diamine.

In some embodiments, there may be a determination of whether a target thickness of as-deposited carbon-containing material on the substrate has been achieved following one or more cycles of forming a compound layer (e.g., following the formation of the first and second portions of a compound layer). If a target thickness of as-deposited carbon-containing material has not been achieved, another cycle of forming first and second portions of a compound layer is performed. If a target thickness of as-deposited carbon-containing; material has been achieved, another cycle to form another compound layer is not started. Exemplary numbers of cycles for the formation of compound layers may include 1 cycle to 2000 cycles. Additional exemplary ranges for the number of cycles may include 50 cycles to 1000 cycles, and 100 cycles to 750 cycles, among other exemplary ranges. Exemplary ranges of target thickness to discontinue further cycles of forming compound layers include about 10 nm to about 500 nm. Additional exemplary thickness ranges may include about 50 run to about 300 nm, and 100 nm to about 200 nm, among other exemplary thickness ranges.

In yet more embodiments, the as-deposited carbon-containing layer on the substrate may be annealed to form the carbon-containing mask layer 210. Exemplary annealing may involve a thermal anneal of the as-deposited carbon-containing, material made up of one or more successive compound layers. Exemplary temperature ranges for the thermal anneal may include about 100° C. to about 600° C. Additional exemplary temperature ranges may include about 200° C. to about 500° C., and about 300° C. to about 450° C., among other temperature ranges. Exemplary times for the thermal anneal may include ranges of about 1 minute to about 120 minutes, about 10 minutes to about 60 minutes, and about 20 minutes to about 40 minutes, among other exemplary time ranges.

Method 100 still further includes the selective removal of the first portion of the silicon containing material at operation 120. In embodiments, the removal operation etches a greater thickness of the silicon-containing material on the sidewall surfaces than the top surfaces of the trenches 204*a*-*b*. In still further embodiments, the carbon-containing mask layer 210 protects the as-deposited first portion of the silicon-containing on the bottom surfaces of the trenches 204*a*-*b* from being removed during the removal operation 120, as shown in FIG. 21).

Without being bound by any particular theory of operation, it is believed that the directional plasma treatment preferentially modifies the first portion of the silicon-containing material on the top and bottom surfaces of the trenches 204*a*-*b* relative to the material deposited on the sidewall surfaces. The modified silicon-containing material on the top and bottom surfaces seems to be more etch resistant. This leads to higher sidewall etch rate than a top surface etch rate. Meanwhile, the silicon-containing material on the bottom surface as a zero etch rate due to the presence of the carbon-containing mask layer 210.

In additional embodiments, the removal operation 120 removes substantially all of the first portion of silicon-containing material from the sidewall surfaces of the trenches 204*a*-*b*, and leaves some of the top surfaces. In some embodiments, removing substantially all of the sidewall material means that at least about 95%, 98% or 99% of the surface area of the sidewalls has been etched. In some embodiments, removing substantially all of the sidewall material includes a nucleation delay for a subsequent deposition process.

In one or more embodiments, the etching operation 120 includes exposing the substrate surface to one or more of a second carrier gas or a second reactant gas. In some embodiments, the second carrier gas comprises one or more of argon (Ar), helium (He) or nitrogen ($N_2$). In some embodiments, the second reactant gas comprises one or more of $Cl_2$, $H_2$, $NF_3$ or HCl. In some embodiments, the second reactant gas comprises or consists essentially of $H_2$. In some embodiments, each of the second carrier gas or the second reactant gas are flown onto the substrate surface independently at a flow rate in a range of from 40 sccm to 10000 sccm, from 40 sccm to 5000 sccm, from 40 sccm to 2000 sccm, from 40 sccm to 1000 sccm, from 40 sccm to 500 sccm, from 40 sccm to 100 sccm, from 100 sccm to 10000 sccm, from 100 sccm to 5000 sccm, from 100 sccm to 2000 sccm, from 100 sccm to 1000 sccm, from 100 sccm to 500 sccm, from 250 sccm to 10000 sccm, from 250 sccm to 5000 sccm, from 250 sccm to 2000 sccm, from 250 sccm to 1000 sccm, from 250 sccm to 500 sccm, from 500 sccm to 10000 sccm, from 500 sccm to 5000 sccm, from 500 sccm to 2000 sccm or from 500 sccm to 1000 sccm.

In one or more embodiments, the removal operation 120 includes maintaining the structured substrate 202 at a temperature in a range of from 15° C. to 250° C., from 15° C. to 225° C., from 15° C. to 200° C., from 15° C. to 175° C., from 15° C. to 150° C., from 15° C. to 125° C., from 15° C. to 100° C., from 25° C. to 250° C., from 25° C. to 225° C., from 25° C. to 200° C., from 25° C. to 175° C., from 25° C. to 150° C., from 25° C. to 125° C., from 25° C. to 100° C., from 50° C. to 250° C., from 50° C. to 225° C., from 50° C. to 200° C., from 50° C. to 175° C., from 50° C. to 150° C., from 50° C. to 125° C., from 50° C. to 100° C., from 75° C. to 250° C., from 75° C. to 225° C., from 75° C. to 200° C., from 75° C. to 175° C., from 75° C. to 150° C., from 75° C. to 125° C. or from 75° C. to 100° C. In some embodiments, the structured substrate is maintained at the same temperature during the deposition operation 110 and the removal operation 120. In some embodiments, the structured substrate 202 is maintained at a different (ΔT>10° C.) temperature during the deposition operation 110 and the etching operation 120.

In one or more embodiments, the removal operation 120 includes maintaining the reaction region that includes the structured substrate 202 at a pressure in a range of from 0.1 Torr to 12 Torr, from 0.5 Torr to 12 Torr, from 1 Torr to 12 Torr, from 2 Torr to 12 Torr, from 3 Torr to 12 Torr, from 4 Torr to 12 Torr, from 0.1 Torr to 10 Torr, from 0.5 Torr to 10 Torr, from 1 Torr to 10 Torr, from 2 Torr to 10 Torr, from 3 Torr to 10 Torr, from 4 Torr to 10 Torr, from 0.1 Torr to 8 Torr, from 0.5 Torr to 8 Torr, from 1 Torr to 8 Torr, from 2 Torr to 8 Torr, from 3 Torr to 8 Torr, from 4 Torr to 8 Torr, from 0.1 Torr to 5 Torr, from 0.5 Torr to 5 Torr, from 1 Torr to 5 Torr, from 2 Torr to 5 Torr, from 3 Torr to 5 Torr or from 4 Torr to 5 Torr.

In some embodiments, the removal operation 120 includes an etch plasma. In some embodiments, the etch plasma is a conductively-coupled plasma (CCP) or inductively coupled plasma (ICP). In some embodiments, the etch plasma is a direct plasma or a remote plasma. In some embodiments, the etch plasma is operated at a power in a range of from 0 W to 500 W, from 50 W to 500 W, from 50 W to 400 W, from 50 W to 300 W, from 50 W to 200 W, from 50 W to 100 W, from 100 W to 500 W, from 100 W to 400 W, from 100 W to 300 W, from 100 W to 200 W, from 200 W to 500 W, from 200 W to 400 W or from 200 W to 300 W. In some embodiments, the minimum power for the plasma is greater than 0 W.

In some embodiments, the removal operation 120 occurs at a continuous power level. In some embodiments, the etch process occurs with second HFRF plasma pulses. In some embodiments, the each of the plurality of second HFRF plasma pulses are independently generated at a second power is in a range of from 0 W to 500 W, from 50 W to 500 W, from 50 W to 400 W, from 50 W to 300 W, from 50 W to 200 W, from 50 W to 100 W, from 100 W to 500 W, from 100 W to 400 W, from 100 W to 300 W, from 100 W to 200 W, from 200 W to 500 W, from 200 W to 400 W or from 200 W to 300 W. In some embodiments, the minimum second plasma power is greater than 0 W. In some embodiments, the power of the pulses are the same during the etching treatment. In some embodiments, the power of the pulses varies during the etching treatment.

In one or more embodiments, the plurality of second HFRF plasma pulses have a duty cycle in arrange of from 1% to 50%, from 1% to 45%, from 1% to 40%, from 1% to 35%, from 1% to 30%, from 1% to 25%, from 1% to 20%, form 1% to 15%, from 1% to 10%, from 5% to 50%, from 5% to 45%, from 5% to 40%, from 5% to 35%, from 5% to 30%, from 5% to 25%, from 5% to 20%, form 5% to 15%, from 5% to 10%, from 10% to 50%, from 10% to 45%, from 10% to 40%, from 10% to 35%, from 10% to 30%, from 10% to 25%, from 10% to 20% or form 10% to 15%. In some embodiments, the duty cycles of the pulses are the same during the etching treatment. In some embodiments, the duty cycle of the pulses varies during the etching treatment.

In one or more embodiments, the each of the plurality of second HFRF plasma pulse has a pulse width in a range of from 5 msec to 50 μsec, from 4 msec to 50 μsec, from 3 msec to 50 μsec, from 2 msec to 50 μsec, from 1 msec to 50 μsec, from 800 μsec to 50 μsec, from 500 μsec to 50 μsec, from 200 μsec to 50 μsec, from 5 msec to 100 μsec, from 4 msec to 100 μsec, from 3 msec to 100 μsec, from 2 msec to 100 μsec, from 1 msec to 100 μsec, from 800 μsec to 100 μsec, from 500 μsec to 100 μsec and from 200 μsec to 100 μsec. In some embodiments, the pulse width of the pulses are the same during the etching treatment. In some embodiments, the pulse width of the pulses varies during the etching treatment.

In one or more embodiments, the each of the plurality of second HFRF plasma pulses independently has a pulse frequency in a range of from 0.1 kHz to 20 kHz, from 0.1 kHz to 15 kHz, from 0.1 kHz to 10 kHz, from 0.1 kHz to 5 kHz, 0.5 kHz to 20 kHz, from 0.5 kHz to 15 kHz, from 0.5 kHz to 10 kHz, from 0.5 kHz to 5 kHz, 1 kHz to 20 kHz, from 1 kHz to 15 kHz, from 1 kHz to 10 kHz, from 1 kHz to 5 kHz, 2 kHz to 20 kHz, from 2 kHz to 15 kHz, from 2 kHz to 10 kHz or from 2 kHz to 5 kHz. In some embodiments, the frequencies of the pulses are the same during the removal operation 120. In some embodiments, the frequency of the pulses varies during the removal operation 120.

In one or more embodiments, the plurality of second HFRF pulses have a second radio frequency in a range of from 5 MHz to 20 MHz, from 5 MHz to 15 MHz, from 5 MHz to 10 MHz, from 10 MHz to 20 MHz or from 10 MHz to 15 MHz. In one or more embodiments, the plurality of second HFRF pulses have the second radio frequency of 13.56 MHz. In some embodiments, the radio frequencies of the pulses are the same during the etching treatment. In some embodiments, the radio frequency of the pulses varies during the etching treatment. In one or more embodiments, the each of the plurality of second HFRF pulses independently has a second radio frequency in a range of from 5 MHz to 20 MHz, from 5 MHz to 15 MHz, from 5 MHz to 10 MHz, from 10 MHz to 20 MHz or from 10 MHz to 15 MHz. In one or more embodiments, the each of the plurality of second HFRF pulses independently has the second radio frequency of 13.56 MHz.

Method 100 yet also includes removing the carbon-containing mask layer 210 at operation 125. In embodiments, the mask removal operation 125 may include heating the mask layer 210 in an oxidizing atmosphere to convert the mask material into carbon dioxide, water vapor and ash. In further embodiments, the oxidizing atmosphere may include atomic oxygen, and molecular oxygen ($O_2$), among other oxygen-containing gases. In additional embodiments, the oxidizing compounds may be used to generate an oxidizing plasma that makes contact with the mask layer 210. In more embodiments, the removal operation 125 may include increasing the temperature of the mask layer 210 to greater than or about 100° C., greater than or about 110° C., greater than or about 125° C., greater than or about 150° C., greater than or about 175° C., greater than or about 200° C., greater than or about 225° C., greater than or about 250° C., greater than or about 300° C., or more.

Method 100 additionally includes a decision operation 130 after completing a cycle of depositing and etching a portion of the silicon-containing material and removing the carbon-containing mask layer described in operations 105-125 above. In embodiments, the decision operation evaluates whether the trenches 204*a*-*b* are adequately filled with the silicon-containing material. In some embodiments, when the trenches have been adequately filled (e.g., completely filled), the method 100 can be stopped, as illustrated in operation 135 of FIG. 1. In additional embodiments, the structured substrate 202 may be subjected to post-gapfill processing. On the other hand, if the trenches have not been adequately filled the method 100, begin another cycle of depositing a portion of the silicon containing material as described in operation 110. In embodiments, the method 100 may include greater than or about 2 cycles, greater than or about 3 cycles, greater than or about 4 cycles, greater than or about 5 cycles, greater than or about 6 cycles, greater than or about 7 cycles, greater than or about 8 cycles, greater than or about 9 cycles, greater than or about 10 cycles, greater than or about 15 cycles, greater than or about 20 cycles, greater than or about 25 cycles, or more.

The present technology permits the deposition of silicon-containing materials such as amorphous silicon and silicon nitride in high aspect ratio features, such as trenches, of a structured substrate. The use of a selectively deposited MLD carbon mask layer to protect selected portions of the silicon-containing materials during removal operation of other portions of the material increases the deposition efficiency of the present methods. In embodiments, the methods may be characterized by an increased deposition efficiency, as measured by a decreased deposition time, of greater than or about 5%, greater than or about 10%, greater than or about 15%, greater than or about 20%, greater than or about 25%, or more.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the pixel structure" includes reference to one or more pixel structures and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A semiconductor processing method comprising:
providing a structured semiconductor substrate comprising a trench having a bottom surface and top surfaces laterally adjacent to the bottom surface;
depositing a silicon-containing material on the bottom surface of the trench for at least one deposition cycle, wherein each deposition cycle comprises:
depositing the silicon-containing material on the bottom surface and top surfaces of the trench;
subsequent to depositing the silicon-containing material, treating the silicon-containing material with ions of one or more of argon, helium, and hydrogen, wherein the ions are accelerated in a direction orthogonal to the structured semiconductor substrate;
subsequent to treating the silicon-containing material, depositing a carbon-containing mask layer on a portion of the silicon-containing material on the bottom surface of the trench, wherein the carbon-containing mask layer is not formed on the top surfaces of the trench;
removing the silicon-containing material from the top surfaces of the trench; and
removing the carbon-containing mask layer from the silicon-containing material on the bottom surface of the trench, wherein the portion of the silicon-containing material remains on the bottom surface of the trench.

2. The semiconductor processing method of claim 1, wherein depositing the carbon-containing mask layer is a molecular layer deposition process comprising:
depositing a first portion of a carbon-containing layer on the portion of the silicon-containing material on the bottom surface of the trench, wherein the first portion of the carbon layer is deposited from a first carbon-containing deposition precursor having a first reactive moiety;
removing the first carbon-containing deposition precursor from a substrate processing region in contact with the structured semiconductor substrate;
depositing a second portion of the carbon-containing layer on the first portion of the carbon-containing layer, wherein the second portion of the carbon-containing layer is deposited from a second carbon-containing deposition precursor that includes a second reactive moiety operable to react with the first reactive moiety on the first carbon-containing deposition precursor; and
annealing the as-deposited first and second portions of the carbon-containing layer to form the carbon-containing mask layer.

3. The semiconductor processing method of claim 2, wherein the first reactive moiety comprises an aldehyde-containing moiety and the second reactive moiety comprises an amine-containing moiety.

4. The semiconductor processing method of claim 1, wherein the removing of the carbon-containing mask layer comprises heating the carbon-containing mask layer in an oxygen-containing atmosphere.

5. The semiconductor processing method of claim 1, wherein the at least one deposition cycle comprises greater than or equal to five deposition cycles.

6. The semiconductor processing method of claim 1, wherein the trench is characterized by a depth-to-width aspect ratio of greater than or equal to 3:1.

7. The semiconductor processing method of claim 6, wherein the silicon-containing material comprises amorphous silicon or silicon nitride.

8. A semiconductor processing method comprising:
providing a structured semiconductor substrate comprising a trench having a bottom surface, top surfaces, and sidewall surfaces adjacent to the bottom surface and top surfaces;
depositing a first portion of a silicon-containing layer on the trench, wherein the first portion of the silicon-containing layer is characterized by a bottom thickness on the bottom surface of the trench that is greater than a sidewall thickness on the sidewall surfaces of the trench;

treating the first portion of the silicon-containing layer with ions of one or more of argon, helium, and hydrogen, wherein the ions are accelerated in a direction orthogonal to the structured semiconductor substrate;

subsequent to treating the first portion of the silicon-containing layer, forming a carbon-containing mask layer on the first portion of the silicon-containing layer on the bottom surface of the trench;

removing at least some of the first portion of the silicon-containing layer from the top surfaces and the sidewall surfaces of the trench, wherein the carbon-containing mask layer prevents the removal of the first portion of the silicon-containing layer from the bottom surface of the trench;

removing the carbon-containing mask layer from the bottom surface of the trench; and forming a second portion of the silicon-containing layer on the trench.

9. The semiconductor processing method of claim 8, wherein the depositing of the first portion of the silicon-containing layer on the trench comprises:

generating a deposition plasma in a plasma deposition chamber containing the structured semiconductor substrate, wherein the deposition plasma is generated from deposition precursors comprising a silicon-containing precursor, argon, helium, and molecular hydrogen; and depositing the first portion of the silicon-containing layer on the trench from species formed within the deposition plasma in the plasma deposition chamber.

10. The semiconductor processing method of claim 9, wherein the deposition plasma is generated by supplying RF power to the deposition precursors at a power level of less than or about 500 Watts.

11. The semiconductor processing method of claim 8, wherein the removing at least some of the first portion of the silicon-containing layer from the top surfaces and the sidewall surfaces of the trench comprises contacting the first portion of the silicon-containing layer with an etch plasma, wherein the etch plasma comprises hydrogen ions.

12. The semiconductor processing method of claim 11, wherein the etch plasma is generated by supplying RF power to etch precursors at a power level of greater than or about 1500 Watts.

13. The semiconductor processing method of claim 8, wherein the first portion and the second portion of the silicon-containing layer comprise amorphous silicon or silicon nitride.

* * * * *